US006972555B2

(12) United States Patent
Balko et al.

(10) Patent No.: US 6,972,555 B2
(45) Date of Patent: Dec. 6, 2005

(54) ELECTRONIC ELECTRICITY METER HAVING CONFIGURABLE CONTACTS

(75) Inventors: Norbert H. Balko, Harrison City, PA (US); Jeffery F. Fye, DuBois, PA (US); Jeffrey L. Fischer, DuBois, PA (US); Matthew E. M. Storkey, Trumpington (GB); Edward G. Colby, Cambridge (GB)

(73) Assignee: M&FC Holding, LLC, Wilmington, DE (US)

( * ) Notice: Subject to any disclaimer, the term of this patent is extended or adjusted under 35 U.S.C. 154(b) by 0 days.

(21) Appl. No.: 10/772,818

(22) Filed: Feb. 5, 2004

(65) Prior Publication Data

US 2005/0177324 A1    Aug. 11, 2005

(51) Int. Cl.[7] ............................................. G01R 11/32
(52) U.S. Cl. .................................. 324/142; 324/103 R
(58) Field of Search ............................ 324/142, 103 R, 324/156–157; 439/876, 517; 702/45, 60–61; 361/668–670

(56) References Cited

U.S. PATENT DOCUMENTS

| | | | | |
|---|---|---|---|---|
| 5,442,282 A | * | 8/1995 | Rostoker et al. | 324/158.1 |
| 6,186,842 B1 | * | 2/2001 | Hirschbold et al. | 439/876 |
| 6,463,395 B1 | * | 10/2002 | Iorga | 702/107 |
| 6,493,644 B1 | * | 12/2002 | Jonker et al. | 702/61 |
| 6,611,772 B1 | | 8/2003 | Lavoie et al. | |
| 6,615,147 B1 | * | 9/2003 | Jonker et al. | 702/61 |
| 6,687,627 B1 | * | 2/2004 | Gunn et al. | 702/61 |
| 6,792,364 B2 | * | 9/2004 | Jonker et al. | 702/61 |
| 6,825,776 B2 | * | 11/2004 | Lightbody et al. | 340/870.02 |

OTHER PUBLICATIONS

American National Standard Requirements for Watthour Meter Sockets, Published by the Institute of Electrical and Electronics Engineers, Inc., ANSI C12-7-1993, Mar. 10, 1994.
American National Standard for Wanhour Meters, ANSI C12.10-1997, Published by National Electrical Manufacturers Association.

* cited by examiner

Primary Examiner—Vinh P. Nguyen
(74) Attorney, Agent, or Firm—Andrus, Sceales, Starke & Sawall, LLP

(57) ABSTRACT

A three-phase electronic electricity meter that includes configurable voltage sensing blades such that the electricity meter can be configured for use with various electrical service types. The electricity meter includes a base having a configuration to correspond to standard ANSI-type sockets. The meter base includes a plurality of individual voltage sensing blades that are received by the ANSI socket. At least one of the voltage sensing blades is movable between a first and a second position such that the voltage sensing blade contacts different areas on a meter circuit board in the first and second positions. A common circuit board can be utilized for different electrical service types and the contact arrangement can be selectively configured by moving the voltage sensing blades between their first and second positions.

19 Claims, 4 Drawing Sheets

ELECTRONIC ELECTRICITY METER HAVING CONFIGURABLE CONTACTS

BACKGROUND OF THE INVENTION

The present invention generally relates to an electronic electricity meter for monitoring the amount of consumed electricity. More specifically, the present invention relates to an electronic three-phase electricity meter that includes configurable voltage sensing blades such that a single control circuit and meter housing can be utilized with different types of electricity services.

Presently, three-phase meters are available for monitoring the amount of three-phase electricity consumed by a facility. Typically, three-phase electricity meters are provided for large residential or industrial applications. A typical three-phase electricity meter monitors the amount of electricity consumed by the facility over each of the three phases of the supplied electricity. The three-phase electricity meter includes internal circuitry that monitors the amount of electricity consumed over each of the three phases of the supplied power. Many different types of measurement circuits have been developed to accurately measure the amount of electricity consumed over each of the three phases.

Since the data collected from electricity meters within an electric distribution network is used for billing customers, the collected data must be accurate. To insure accuracy, different meter forms are used to meter energy consumption for different types of electric services and load ranges. Specifically, within an electric distribution network of a utility, there are many different services and loads that a utility desires to meter. Each type of service and load may require a meter to have a particular form and rating. The term "form", as used in the art, refers to the physical configuration of an electrical service and the term "rating" refers to both the voltage and current ranges.

Typically, a utility must have on hand meters that are configured in a number of different forms and ratings such that the meters can be installed in each location across the distribution network. Typically, the different form and rated meters are stored in inventory such that when a metering application is identified that requires a particular form and rated meter, the meter is readily available and can be installed. In addition to inventory costs, utility personnel must be trained on the installation of different form and rated meters.

For example, a utility may require a meter to have a meter base configuration that conforms to the ANSI 9S, 12S and 16S meter base where the meter may be electrically connected to a 4-wire wye electric connection, a 4-wire delta electrical connection, a 3-wire delta electrical connection, a 3-wire network electrical connection or other configurations. In each of these connections, different current and voltage sensing blades are required to conform to the ANSI meter base configuration to the form of electrical service. For example, in an ANSI 9S meter configuration, the meter base includes six current sensing blades arranged in two rows and up to seven voltage sensing blades positioned between the two rows of current blades. The connections between the seven voltage blades and the metering control circuit are dictated by the ANSI standards and the form of electrical service, such that many meter configurations are possible while allowing the meters to be received in a common socket.

Since a utility must stock multiple different meter configurations, the meter manufacturer must also create different meters to satisfy the demands of its utility customers. In order to satisfy these demands, the meter manufacturer must typically develop different control circuits and meter housings to create the multiple required meter configurations. Thus, the meter manufacturer must maintain a relatively large inventory of parts and must develop specific designs for the different meter configurations.

Therefore, it would be desirable to provide a single meter capable of being used in a plurality of different applications requiring different forms and ratings while utilizing the same ANSI-rated meter base and socket configuration. It would also be desirable to provide such a meter that allows a meter manufacturer to configure the meter for different forms and ratings to eliminate the requirement of having multiple control circuits and meter housings in inventory.

SUMMARY OF THE INVENTION

The present invention is directed to a three-phase electronic electricity meter that is operable to measure and display the amount of consumed three-phase electricity at either a residence or industrial facility. The three-phase electricity meter is configured to be received in a conventional ANSI-type socket located at the facility such that the three-phase electricity that passes through the meter and is consumed at the facility can be measured and displayed. The three-phase electricity meter includes a meter housing having a base member and a cover member. Preferably, the meter housing is enclosed and sealed such that the operating circuitry contained within the meter housing is protected from the environment.

The electricity meter of the present invention includes an internal circuit board that is enclosed within the housing and includes the measurement and operating circuitry to monitor and display the amount of three-phase electricity consumed by the facility. Typically, the measurement circuitry is mounted on one side of a meter circuit board, while the supply of three-phase electricity is supplied, by various contacts, to the back side of the circuit board.

The electricity meter of the present invention includes three separate bus bars that each include a pair of current sensing blades that extend through the back base plate of the meter housing. Each of the bus bars typically includes two spaced sensing blades that are positioned in a configuration such that the electricity meter can be received within a conventional ANSI-type socket receptacle.

The electricity meter further includes a plurality of voltage sensing blades positioned in a single row between the current sensing blades in conformance with an ANSI-standard configuration guideline. Each of the voltage sensing blades is received within the ANSI-type socket and is selectively utilized to monitor the electricity consumed. Based upon the particular form of electrical source, such as wye or delta, select numbers of the voltage sensing blades may be utilized by the measurement circuitry in monitoring the amount of electricity consumed.

In accordance with the present invention, each of the voltage sensing blades includes a main body that extends along a longitudinal axis. The longitudinal axis bisects the main body such that the main body is identical on each side of the longitudinal axis. The uniformity of the main body allows the voltage sensing blades to each be rotated 90° such that the main body can be received by an ANSI-type receptacle in either of these two positions.

Each of the voltage sensing blades includes a depending leg and contact finger extending from the main body. The contact finger and depending leg are offset from the longitudinal axis. The contact finger extends from the depending leg and extends laterally away from the face surface of the main body of the voltage sensing blade. When the voltage blade is mounted in an operating position, the contact finger extends both outward and downward into contact with a contact pad formed on the circuit board. The interaction between the contact finger and contact pad on the circuit board provides an electrical connection between the circuit board and the voltage sensing blade.

At least one of the voltage sensing blades is rotatable between a first position and a second position. When the voltage sensing blade is in the first position, the contact finger engages a first contact pad formed on the circuit board. When the voltage sensing blade is rotated 90° to its second position, the contact finger contacts a second contact pad formed on the circuit board. Preferably, the first contact pad and the second contact pads are positioned on opposite sides of the voltage sensing blade. Each of the first and second contact pads provides an electrical interconnection to different portions of the measurement circuitry used within the electricity meter.

The electricity meter of the present invention, and specifically the voltage sensing blades, allows a single electricity meter to be configured to be utilized with different forms of electricity service. However, the electricity meter of the present invention includes an ANSI-standard base configuration such that the electricity meter can be received within an ANSI-type socket when the voltage sensing blades are either in their first position or their second position. In this manner, the electricity meter of the present invention allows the manufacturer to configure the electricity meter depending upon the form of electrical service, thereby eliminating the need to inventory multiple control circuit configurations and meter housings.

Various other features, objects and advantages of the invention will be made apparent from the following description taken together with the drawings.

BRIEF DESCRIPTION OF THE DRAWINGS

The drawings illustrate the best mode presently contemplated of carrying out the invention.

In the drawings.

DETAILED DESCRIPTION OF THE INVENTION

Figure 1:
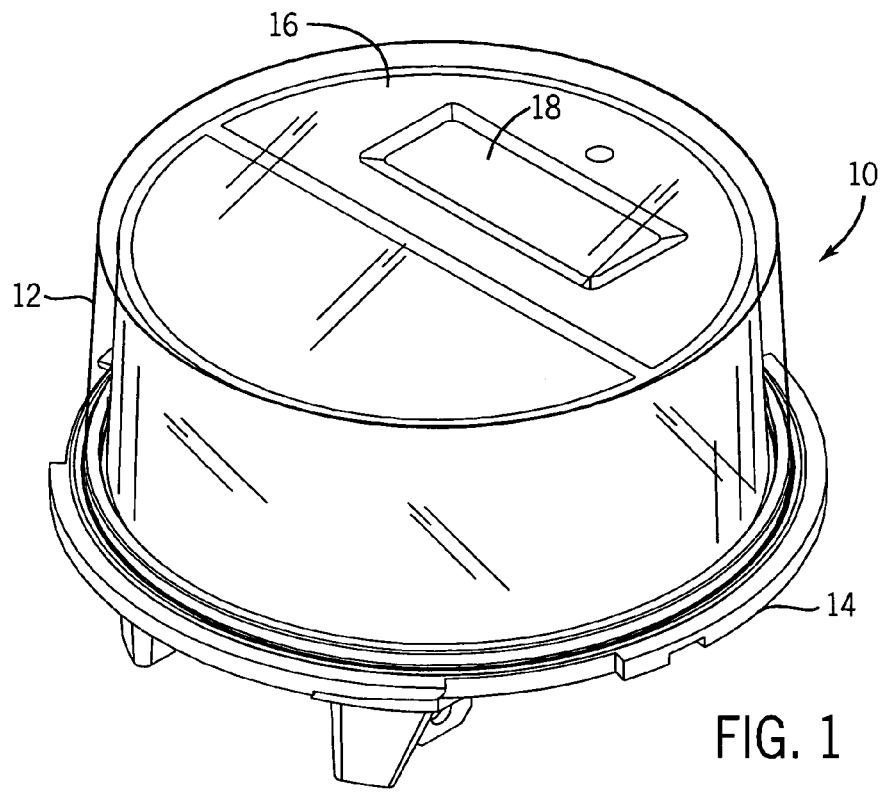
FIG. 1 is a perspective view of a three-phase electronic electricity meter of the present invention.

FIG. 1 illustrates a three-phase electronic electricity meter 10 constructed in accordance with the present invention. The electricity meter 10 includes an enclosed meter housing comprised of a cover member 12 mounted to a base member 14. The cover member 12 includes a generally clear face surface 16 that allows a digital display 18 to be read from the exterior of the electricity meter 10. The cover member 12 and base member 14 are joined to each other in a conventional manner such that the base member 14 and the cover member 12 define a sealed, meter housing. The meter housing prevents moisture and other environmental contaminants from reaching the internal circuitry contained within the three-phase electricity meter 10.

In the present invention, an operating and measurement circuit is contained within the meter housing and operates to control the digital display 18. The specific details of the measurement circuit will not be described in detail, since the measurement circuitry forms no part of the present invention. However, it should be understood that the measurement circuit is well known to those skilled in the art and can vary depending upon the type of information required from the electricity meter 10, which is typically dictated by the utility service provider.

Figure 2:
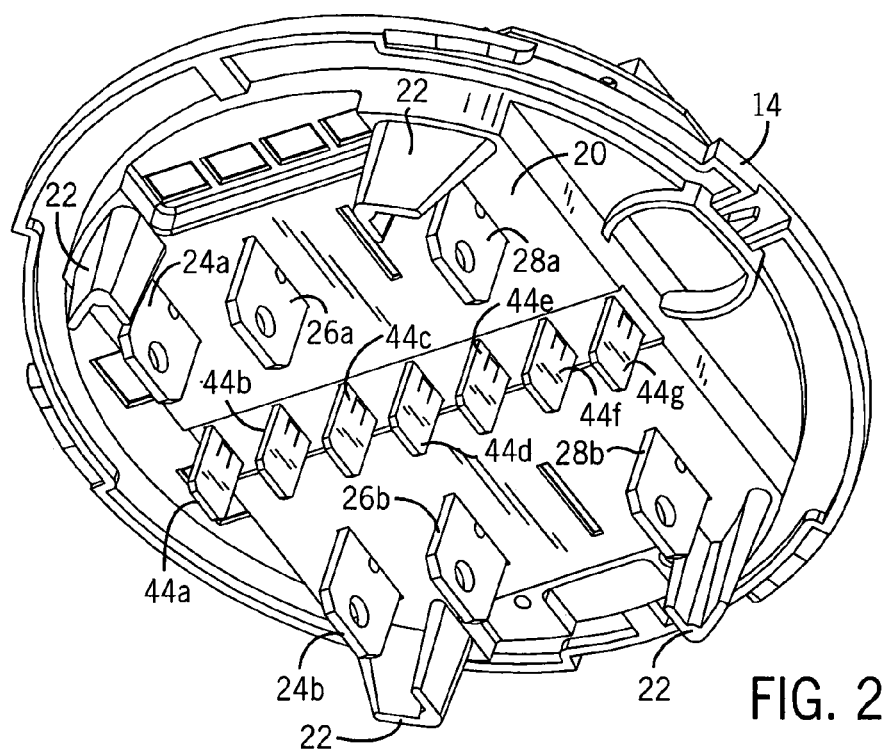
FIG. 2 is a back view of the three-phase electricity meter showing the ANSI-standard configuration of the current sensing blades and voltage sensing blades of the electricity meter.

Referring now to FIG. 2, thereshown is a bottom view of the base member 14 of the electricity meter of the present invention. As illustrated in FIG. 2, the base member 14 includes a generally planar base plate 20 that is formed as part of the base member 14. The base plate 20 includes a plurality of support legs 22 spaced evenly around the base plate 20. The support legs 22 stabilize the electricity meter when the electricity meter is installed in a mating socket positioned in-line with a supply of electricity to either a residential or commercial location. The support legs 22 are typically formed from molded plastic and are formed integrally with the remaining portions of the base member 14.

As shown in FIG. 2, the base member 14 is configured in accordance with ANSI C12.10 form designations. Specifically, the base member 14 is a transformer rated, form 9S meter base. The form ANSI 9S meter base is received within a corresponding ANSI-rated socket that can be inserted into various forms of electric service, such as a 4-wire wye electrical connection, a 4-wire delta electrical connection and a 3-wire delta electrical connection. The configuration of the meter base is common for each of the forms of electrical service such that the receiving socket can be wired into the electricity service according to the utility requirements.

Figure 3:
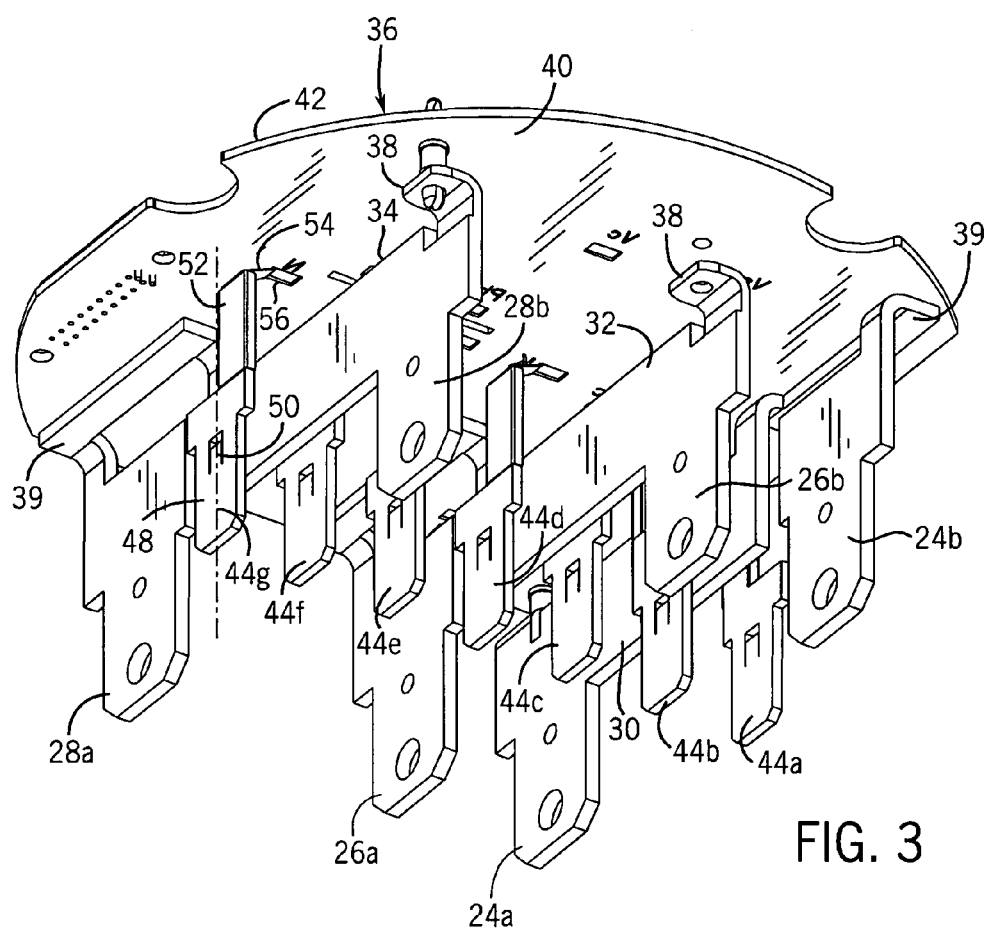
FIG. 3 is a perspective view showing the positioning of the current sensing bus bars and voltage sensing blades and the metering circuit board.

As can be seen in FIG. 2, the base of the electricity meter is configured to have a first pair of sensing blades 24a, 24b, a second pair of sensing blades 26a, 26b and a third pair of sensing blades 28a and 28b. The sensing blades 24–28 are typically configured as current sensing blades and form parts of three bus bars 30, 32 and 34 shown in FIG. 3. As illustrated in FIG. 3, the bus bars 30, 32 and 34 are each securely mounted to a circuit board 36 by a support tab 38 and a sensing flange 39. The circuit board 36 includes a back support surface 40 as well as a front face surface 42. The front face surface 42 of the circuit board 36 includes the measurement circuitry (not shown) that is operable to monitor the amount of electricity consumed by the facility that the electricity meter 10 is monitoring. The measurement circuitry mounted to the front face surface includes a current sensing system that senses the amount of current flowing through the sensing flanges 39 of the bus bars 30, 32 and 34. Such a current sensing system is shown in U.S. Pat. No. 6,414,475, the disclosure of which is incorporated by reference. The measurement circuitry includes a plurality of contact pads that extend through the thickness of the circuit board 36 such that a physical contact made to the back support surface 40 can complete an electrical connection to the measurement circuitry mounted to the front face surface, as will be described in much greater detail below.

Referring back to FIG. 2, the meter base 14 includes a plurality of voltage sensing blades 44a–44g. As shown in FIG. 2, the base member includes seven voltage sensing blades 44a–44g positioned in a single row between the first set of sensing blades (24a, 26a, 28a) and the second set of sensing blades (24b, 26b, 28b). The configuration shown FIG. 2 is the standard ANSI form for a 9S meter base. The meter base shown in FIG. 2 can be received within an ANSI 9S socket that can be configured for many different forms of electricity supplied by the utility.

As an example, in a first configuration, the meter may sense current between the first pair of sensing blades 24a and 24b as well as between the second pair of sensing blades 26a and 26b and the third pair of sensing blades 28a and 28b. In the same configuration, voltage may be sensed utilizing the voltage blades 44a, 44b, 44c and 44g. In an alternate arrangement, only voltage blades 44a, 44c and 44g may be utilized, depending upon the form of the electricity service.

In prior art meter designs, a different circuit board was required for each of the specific configurations for the active voltage sensing blades 44a–44g, which in turn depended upon the form of the electricity service being utilized by a utility. In these prior art meter designs, the meter manufacturer had to keep multiple circuit board design layouts in inventory such that each of the meters could be configured to be utilized in the required service configuration. This prior art meter design increased the number of circuit board designs and housing configurations required in inventory. In accordance with the present invention, the electronic electricity meter 10 is configurable such that a single meter 10 fits in a standard ANSI-rated socket with the ability to configure the meter depending upon the form of the electricity service.

Referring now again to FIG. 3, each one of the voltage sensing blades 44a–44g is shown in its normal position with the base plate of the base member removed. Each of the voltage sensing blades 44a–44g extends along a longitudinal axis, illustrated by dashed line 46. The longitudinal axis 46 bisects a main body 48 of the voltage sensing blade, which is formed from a metallic material. The main body 48 includes mounting tab 50 such that each of the voltage sensing blades can be supported by the base member.

As shown in FIG. 3, each of the voltage sensing blades 44a–44g includes a depending leg 52 that is formed as an extension of the main body 48. The depending leg 52 is offset from the longitudinal axis 46 of the main body, as illustrated.

Each depending leg 52 includes a contact finger 54 that contacts and engages an area formed on the back support surface 40 of the circuit board 36. As illustrated in FIG. 3, the contact finger 54 of the voltage sensing blade 44g engages a contact pad 56. The contact pad 56 provides an electrical connection to a circuit element mounted to the front face surface 42 of the circuit board 36. In this manner, the voltage sensing blades 44a–44g provide the required electrical connections between the electrical socket and the measurement circuit contained within the meter enclosure.

Figure 5:
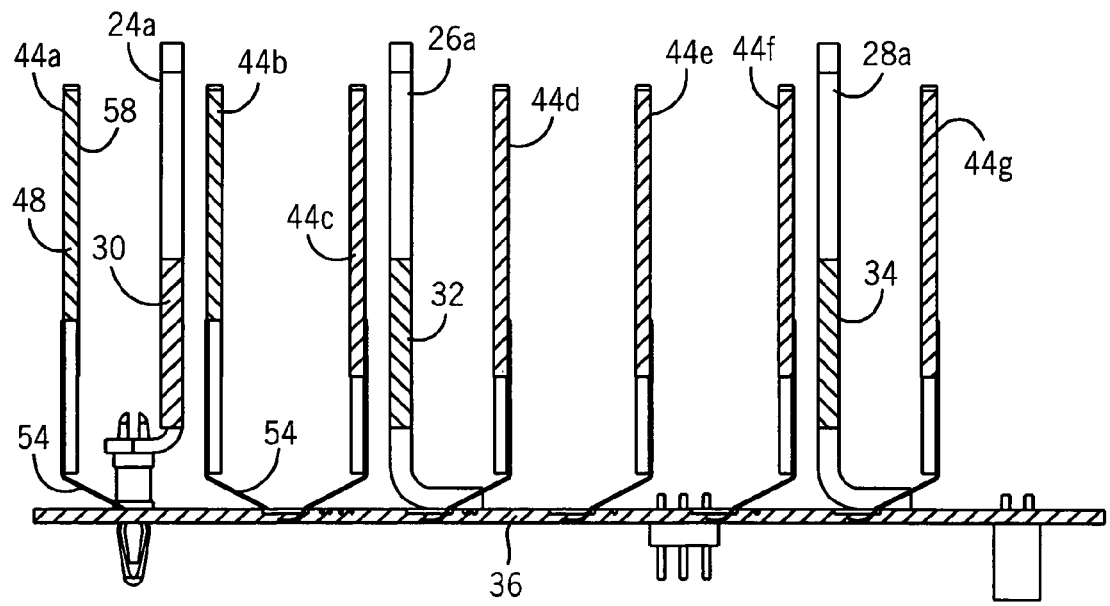
FIG. 5 is a section view taken along line 5—5 of FIG. 4.

Referring now to FIG. 5, the contact finger 54 formed on each of the voltage sensing blades 44a–44g is a metallic element that extends below the main body 48 of each of the sensing blades. The contact finger 54 extends away from a first face surface 58 of each voltage sensing blade and the contact pad that the contact finger 54 engages is spaced away from the first face surface 58.

Figure 4:
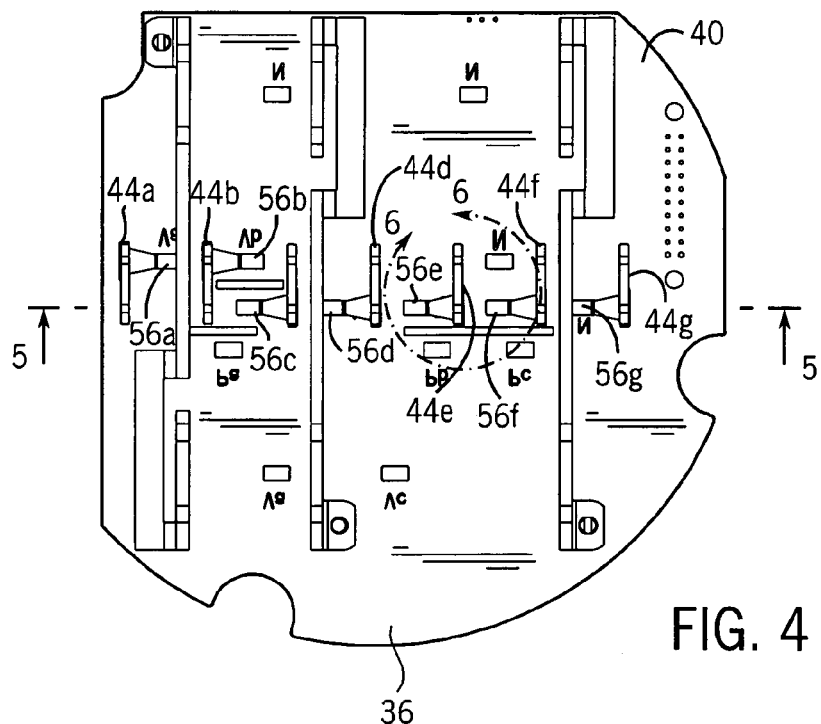
FIG. 4 is a top view of FIG. 3.

Referring back to FIG. 4, each of the voltage sensing blades 44a–44g includes a contact finger 54 that engages one of the primary contact pads 56a–56g formed on the back support surface 40 of the circuit board 36. Thus, when the voltage sensing blades are in the position shown in FIG. 4, each of the voltage sensing blades 44a–44g provides a point of electrical connection to the circuit board 36 through the contact pads 56a–56g. When the electricity meter of the present invention is inserted into a socket, the electrical wires connected to the socket can communicate to the measurement circuitry contained within the electricity meter through the voltage sensing blades 44a–44g. In a typical meter configuration, each of the voltage sensing blades 44a–44g is fixed in a known position and provides electrical connection to desired circuit elements contained within the measurement circuitry. However, in prior art electricity meters, if the form of electric service for the particular installation is different, another meter must be installed having the desired circuitry interconnections. This requires the meter manufacturer to stock different circuit board and housing designs such that a meter could be provided depending upon the service installation.

Figure 6:
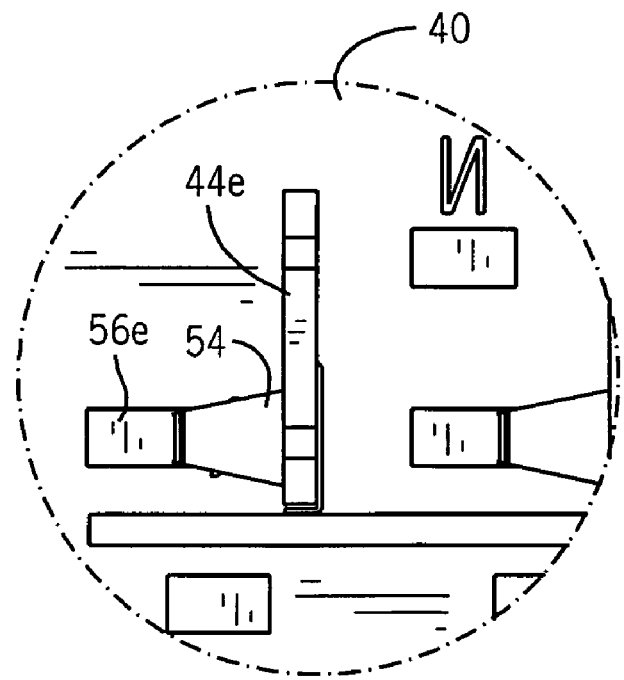
FIG. 6 is an enlarged view of the area shown by lines 6—6 of FIG. 4.
Figure 7:
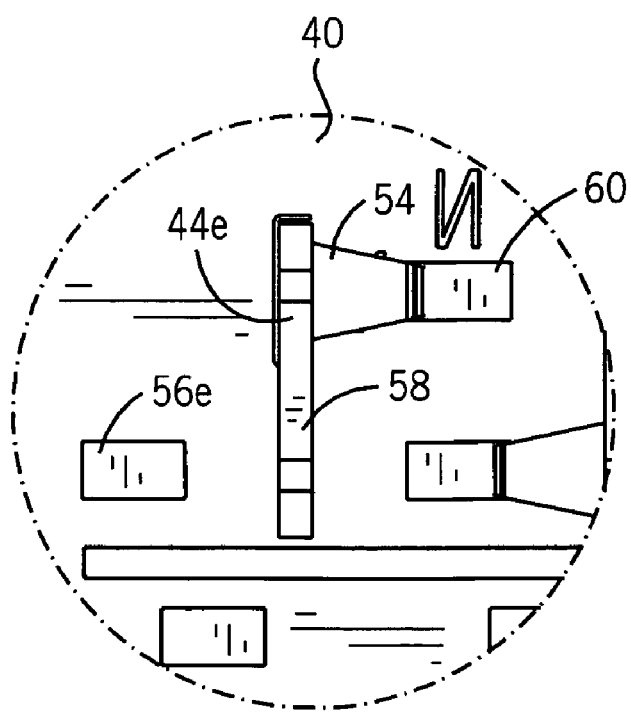
FIG. 7 is a view similar to FIG. 6 illustrating the rotation of one of the voltage sensing blades between one of its two alternate configurations.

Referring now to FIGS. 6 and 7, thereshown is a magnified view of the voltage sensing blade 44e. As illustrated in FIG. 6, the contact finger 54 of the voltage sensing blade 44e is engaged with the primary contact pad 56e formed on the back support surface 40 of the circuit board. In this configuration, the voltage sensing blade 44e provides an electrical connection to a known element in the measurement circuitry for the electricity meter.

Referring now to FIG. 7, the voltage sensing blade 44e is shown in a second position. In the second position, the voltage sensing blade 44e has been rotated 90° relative to the position shown in FIG. 6 such that the contact finger 54 engages a second, alternate contact pad 60. The second, alternate contact pad 60 provides an electrical connection to a different area in the measurement circuit mounted to the circuit board. As can be seen in FIG. 7, the primary contact pad 56e and the second, alternate contact pad 60 are formed on opposite sides of the voltage sensing blade 44e and located on opposite sides of the longitudinal axis that extends through the voltage sensing blade 44e. Since the contact finger 54 is spaced from the longitudinal axis of the voltage sensing blade 44e and extends from the first face surface 58, the rotation of the voltage sensing blade 44e allows for more than one contact point to the circuit board for the single voltage sensing blade 44e.

As can be understood in FIG. 7, when the voltage sensing blade 44e is rotated 90° to the position shown, the configuration for the row of voltage sensing blades 44a–44g (FIG. 3) remains unchanged. Thus, a meter manufacturer can simply rotate one or more of the voltage sensing blades 44a–44g to their alternate position without changing the exterior configuration for the meter base. In this manner, a manufacturer can configure a meter depending upon the type of installation without requiring a different type of circuit board or having to hardwire the electrical interconnection between the voltage sensing blades 44a–44g and the circuit board 36.

Although only the voltage sensing blade 44e is shown in its two alternate positions, it should be understood that any of the voltage sensing blades 44a–44g could be rotated and contact alternate contact pads formed on the circuit board. Thus, the internal configuration and circuit contacts for the meter base can be selectively configured depending upon the utility service requirement. Therefore, multiple meter configurations can be created without having to inventory multiple circuit boards and housing configurations.

Various alternatives and embodiments are contemplated as being within the scope of the following claims particularly pointing out and distinctly claiming the subject matter regarded as the invention.

We claim:

1. An electronic electricity meter for measuring energy consumption of a load and connectable to a standard socket connectable to a plurality of electrical service types, comprising:
   a meter housing including a base member and a cover member;
   a measurement circuit board enclosed within the meter housing, the circuit board including a measurement circuit operable to determine the energy consumption;
   a plurality of bus bars each including a pair of sensing blades, each of the bus bars being coupled to the circuit board and positioned such that the sensing blades extend through the base member in a configuration to engage the standard socket; and
   a plurality of voltage sensing blades extending through the base member in a configuration to engage the standard socket, wherein at least one of the voltage sensing blades is movable between a first position and a second position such that the voltage sensing blade contacts a first location on the circuit board in the first position and contacts a second location on the circuit board in the second position.

2. The electricity meter of claim 1 wherein the configuration of the voltage sensing blades is the same when the voltage sensing blades are moved between the first position and the second position.

3. The electricity meter of claim 1 wherein the voltage sensing blade is movable between the first and second positions and includes a contact finger extending from a main body, the contact finger being in contact with the circuit board in both the first position and the second position to provide an electrical connection to the circuit board.

4. The electricity meter of claim 2 wherein the main body of each voltage sensing blade extends along a longitudinal axis, wherein the contact finger extends away from and is spaced from the longitudinal axis.

5. The electricity meter of claim 4 wherein the voltage sensing blade is rotatable 90° to move the voltage sensing blade between the first position and the second position.

6. The electricity meter of claim 3 wherein the circuit board includes a first contact pad and a second contact pad to receive the contact finger when the voltage sensing blade is moved between the first and second positions.

7. The electricity meter of claim 6 wherein the first contact pad and the second contact pad are spaced on opposite sides of the movable voltage sensing blade.

8. The electricity meter of claim 1 wherein configuration of the bus bar sensing blades and the voltage sensing blades is the electrical service ANSI form 9S.

9. The electricity meter of claim 1 wherein each of the voltage sensing blades are supported by the base member in both the first position and the second position.

10. An electronic electricity meter for measuring energy consumption of a load and connectable to a standard socket configured to receive a plurality of electrical service types, the electricity meter comprising:
    a meter housing;
    a measurement circuit board enclosed in the meter housing, the circuit board including a measurement circuit operable to determine the energy consumption;
    a meter base having a pre-selected form configured to electrically connect to the standard socket;
    a plurality of voltage sensing blades extending through the meter base in a configuration to be received in the standard socket, at least one of the voltage sensing blades being in contact with the circuit board positioned within the meter housing, at least one of the voltage sensing blades being selectively positionable in a first position and a second position, wherein the voltage sensing blade contacts the circuit board at a different location in the first position and the second position.

11. The electricity meter of claim 10 wherein the movable voltage sensing blade includes a contact finger extending from a main body, the contact finger being positionable in contact with the circuit board.

12. The electricity meter of claim 11 wherein the main body of the movable voltage sensing blade extends along a longitudinal axis, wherein the contact finger extends away from and is spaced from the longitudinal axis.

13. The electricity meter of claim 12 wherein the voltage sensing blade is rotatable 90° to move the voltage sensing blade between the first position and the second position.

14. The electricity meter of claim 10 wherein each of the voltage sensing blades are supported by the meter base.

15. The electricity meter of claim 12 wherein the movable voltage sensing blade contacts a first contact pad in the first position and contacts a second contact pad in the second position.

16. The electricity meter of claim 15 wherein the first and second contact pads are positioned on opposite sides of the movable voltage sensing blade.

17. The electricity meter of claim 10 wherein the meter base includes a plurality of bus bars each having a pair of sensing blades, wherein the bus bar sensing blades and the plurality of voltage sensing blades are positioned in a standard configuration.

18. The electricity meter of claim 17 wherein the standard configuration is ANSI form 9S.

19. The electricity meter of claim 11 wherein the contact finger is press fit onto the main body.

* * * * *